United States Patent
Narayana

(10) Patent No.: US 8,504,339 B2
(45) Date of Patent: Aug. 6, 2013

(54) METHOD FOR DOOR SIDE INTRUSION SIMULATION WITH PROGRESSIVE FAILURES

(75) Inventor: Naga A. Narayana, Farmington Hills, MI (US)

(73) Assignee: Nissan North America, Inc., Franklin, TN (US)

( * ) Notice: Subject to any disclaimer, the term of this patent is extended or adjusted under 35 U.S.C. 154(b) by 462 days.

(21) Appl. No.: 12/956,272

(22) Filed: Nov. 30, 2010

(65) Prior Publication Data
US 2012/0136639 A1   May 31, 2012

(51) Int. Cl.
G06G 7/48 (2006.01)
(52) U.S. Cl.
USPC ............................................................ 703/8
(58) Field of Classification Search
USPC ............................. 703/1, 2, 6, 7, 8; 73/12.04
See application file for complete search history.

(56) References Cited

U.S. PATENT DOCUMENTS

| | | | | |
|---|---|---|---|---|
| 5,652,375 A | * | 7/1997 | Da Re' | 73/12.04 |
| 6,907,391 B2 | * | 6/2005 | Bellora et al. | 703/8 |
| 2007/0143087 A1 | * | 6/2007 | Musale et al. | 703/8 |
| 2008/0312882 A1 | * | 12/2008 | Kumagai | 703/1 |
| 2010/0131256 A1 | * | 5/2010 | Hallquist | 703/8 |
| 2010/0235149 A1 | * | 9/2010 | Allen et al. | 703/2 |
| 2011/0153298 A1 | * | 6/2011 | Stein et al. | 703/8 |

OTHER PUBLICATIONS

Gandhi et al., "Data based models for automobile side impact analysis and design evaluation", Intl. Journal of Impact Enquiry, 1996.*

* cited by examiner

*Primary Examiner* — Kandasamy Thangavelu
(74) *Attorney, Agent, or Firm* — Young, Basile, Hanlon & MacFarlane, P.C.

(57) ABSTRACT

A method for simulating deformation of a body element of a motor vehicle that occurs during an impact event includes providing a model of the body element that includes an initial load distribution pattern. A first simulation output is generated during a first portion of the impact event using the initial load distribution pattern and includes data indicative of the deformation of the body element. Whether a portion of the body element is in a failure condition is determined based on the first simulation output. If a failure condition is determined, the load distribution pattern of at least a portion of the body element is updated, and a second simulation output including data indicative of the deformation of the body during a second portion of the impact event is generated using the updated load distribution pattern.

19 Claims, 6 Drawing Sheets

METHOD FOR DOOR SIDE INTRUSION SIMULATION WITH PROGRESSIVE FAILURES

TECHNICAL FIELD

The present invention generally pertains to the field of computer-assisted simulation of impacts, and more particularly, to a method for simulation application of an impact load to an automobile door structure.

BACKGROUND

Computer-aided engineering technologies have previously been applied to simulate application of impact loads to vehicle bodies. These techniques are typically intended to replicate the type of crash testing that will eventually be performed on a completed automobile. Utilization of computer-aided engineering technologies, however, allows a simulated result of one or more of these tests to be considered during the design phase of an automobile, thus allowing automobile designs to be modified during a design phase to provide better structural performance during application of an impact load to the vehicle body.

In practice, these computer-aided engineering technologies include production of a three-dimensional model of the geometry and material properties of the automobile. Crash simulations are performed using these models, typically using the finite element method. The results of the simulation are typically rendered in the form of forces, stresses, and strain values that are generated within specific portions and features of the body of the automobile. These simulations also typically provide, as an end product, a visual representation of the deformations experienced within the automobile body during application of the impact loading.

The simulations are usually designed to correspond to tests that will be performed upon the completed vehicle. In the United States, these tests are specified by the Federal Motor Vehicle Safety Standards (FMVSS).

One particular area of interest regards the performance of the doors of the automobile during a side impact-type crash. In particular FMVSS 214 specifies a quasi-static door side intrusion test to determine the sufficiency of the strength of the door and the integrity of the mounting of the door with respect to the body of the vehicle. During a side impact type crash, the door structure of an automobile typically experiences intense rupture within its panels and the connections of its panels, such as spot welds, bolts, and hems. As a result of these ruptures, the manner in which the impact loading is distributed within the structure of the door changes significantly during the course of application of the impact force to the door due to fracture of the panels and their connections.

The door side intrusion test of FMVSS 214 subjects a door that is mounted to the body of a vehicle to an impact using an intruder that impacts the body at a low speed of about 0.2 in/sec in the physical test. The performance is simulated in the finite element analysis with a speed of 5 meters per second to keep the solution time practicable. The structural resistance offered by the door against intrusion by the intruder is measured to determine the initial, intermediate, and ultimate strength of the structure. During the testing, the integrity of the closure mountings of the door with respect to the vehicle body structure, such as at the latch and the hinges, is monitored to ensure that structural integrity of the closure mountings is maintained until the ultimate load is reached. Because the test causes severe deformation of the door structure and causes multiple ruptures of the panels and their connections, the sequence of these fractures is highly relevant to the overall performance of the door structure during the side intrusion testing.

During early phases of the side intrusion event, panels and associated components of the door structure buckle, and some fractures may occur at connections between components. When the ultimate strength of the structure is reached, the door structure has typically been subjected to widespread panel tear, spot weld rupture, hem separations, and potentially separation of the door at the latch and the hinge mountings. Of course, the structural performance of the door at its ultimate strength varies based on the geometry and layout of the door structure in terms of its cross members and reinforcements.

Although door side intrusion-type testing has previously been conducted using computer-aided engineering methods, success has been limited. Conventionally, non-linear finite element analysis solutions are utilized to simulate the structural performance of an automobile door during a side intrusion-type impact loading. In such an analysis, structural failures are judged after the fact, by applying rupture criteria to the mathematical model of the automobile door structure. This means that ruptures are not considered during the course of the analysis but only the most critical or 'first' failure is indicated over the analysis. Thus, the conventional non-linear finite element analysis modeling that is applied to door side intrusion modeling does not consider changes in the distribution of the impact loading within the door structure as a result of the structural failures that occur during the course of application of the impact loading.

It would be desirable to have a door side intrusion simulation method for simulating application of an impact load to an automobile door in which a changing impact load as a result of structural failures is properly accounted for.

SUMMARY

The invention provides methods for simulating deformation of a body element of a motor vehicle that occurs during an impact event. According to one method taught herein, a model of the body element is provided. The model includes an initial load distribution pattern. A first simulation output is generated during a first portion of the impact event using the initial load distribution pattern and includes data indicative of the deformation of the body element. Whether a portion of the body element is in a failure condition is determined based on the first simulation output. If a failure condition is determined, the load distribution pattern of at least a portion of the body element is updated, and a second simulation output including data indicative of the deformation of the body during a second portion of the impact event is generated using the updated load distribution pattern.

The model of the body element may include one or more yieldable features. Furthermore, the model of the body element may include a rupture model for the one or more yieldable features. In this case, the failure condition may be determined if one or more of the yieldable features has failed using the rupture model.

The rupture model for the one or more yieldable features may be calibrated using empirical test results that correlate the first simulation output to the empirical test results. This may be done by adjusting at least one rupture criteria of the rupture model of the one or more yieldable features based on the empirical test results to conform the first simulation output to the empirical test results. Alternatively, the rupture model for the one or more yieldable features may be calibrated using empirical test results to correlate the first simulation output to the empirical test results such that a simulated rupture sequence matches an empirically-observed rupture sequence.

The one or more yieldable features may include at least one of a bolt, a spot weld, a panel, or a hem.

When the one or more yieldable features includes a bolt, the rupture model for the bolt may indicate whether forces and/or stresses developed within a predetermined area surrounding the bolt, as represented by the model, exceed an assumed rupture strength predetermined with adequate physical coupon tests for the bolt. In this case, the failure condition includes failure of the bolt when the forces developed within the predetermined area surrounding the bolt, as represented by the model, exceed the assumed rupture strength for the bolt. When this occurs, the updated load distribution pattern incorporates failure of the bolt.

When the one or more yieldable features includes a spot weld, the rupture model for the spot weld may indicate whether the forces and/or stresses developed within a predetermined area surrounding the spot weld, as represented by the model, exceed an assumed rupture strength predetermined with adequate physical coupon tests for the spot weld. In this case, the failure condition may include failure of the spot weld when the forces developed within the predetermined area surrounding the spot weld, as represented by the model, exceed the assumed rupture strength for the spot weld. When this occurs, the updated load distribution pattern incorporates failure of the spot weld.

When the one or more yieldable features includes the panel, the rupture model may indicate whether the stress and/or strain introduced within at least a portion of the panel exceeds an assumed rupture strain predetermined with adequate physical coupon tests for the panel. When this happens, the failure condition may include failure of the panel when the rupture model indicates that the strain induced within at least a portion of the panel exceeds an assumed rupture strain for the panel. When this occurs, the updated load distribution pattern incorporates failure of the panel.

When the one or more yieldable features include the hem, the rupture model may indicate whether the forces and/or stresses developed within a predetermined area surrounding the hem, as represented in the model, exceed an assumed rupture strength for the hem. When this occurs, the failure condition may include failure of the hem when the rupture model for the hem indicates that the stress developed at the contact point exceeds the assumed rupture stress value for the hem. In this case, the updated load distribution pattern incorporates failure of the hem.

The body element of the motor vehicle may be a door structure including a door and a body portion surrounding the door.

In this case, the one or more yieldable features may include a mounting structure that connects the door to the body portion surrounding the door.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1A:
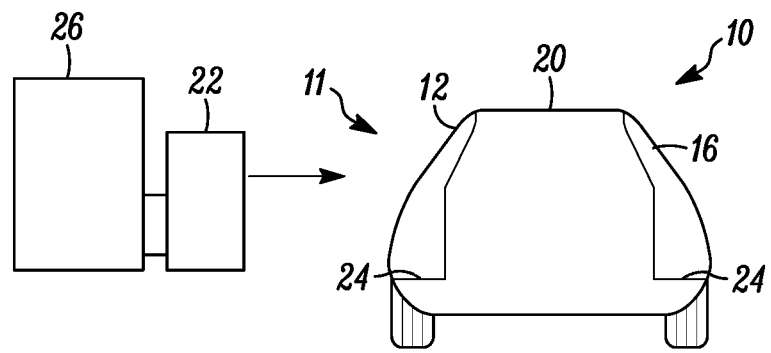
FIG. 1A is a rear view showing a conventional physical test for side door intrusion being performed on a vehicle.
Figure 1B:
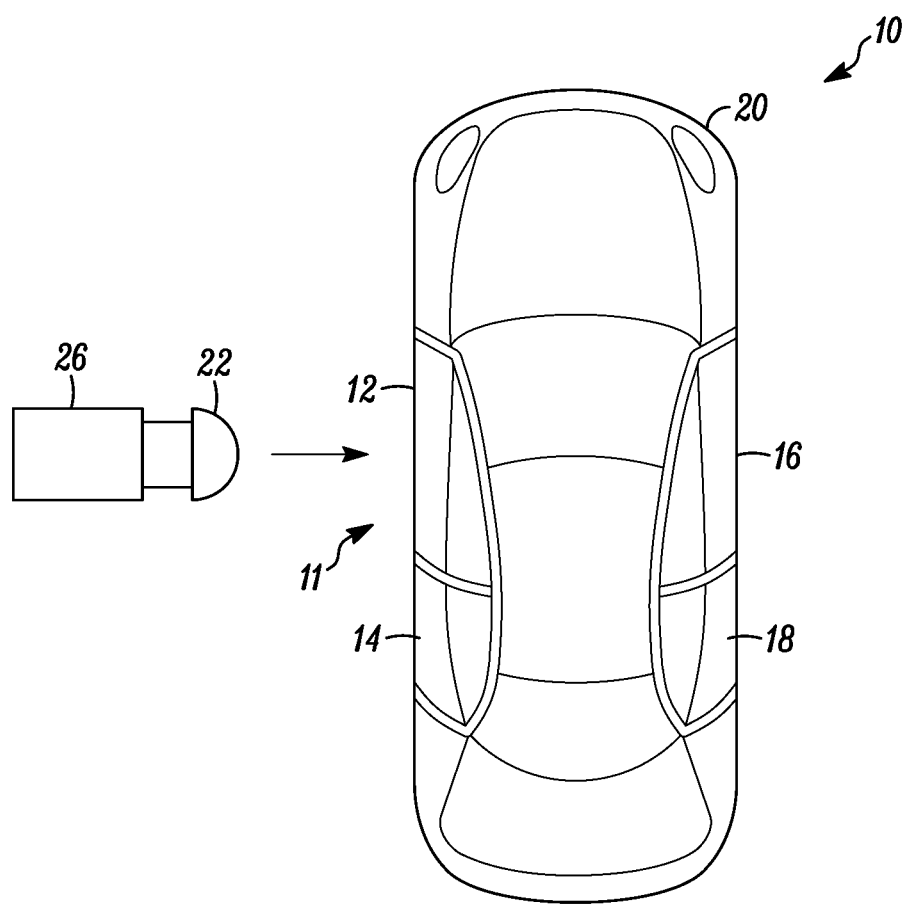
FIG. 1B is a top view showing the conventional physical test for side door intrusion being performed on the vehicle.

FIGS. 1A-1B show a vehicle 10 that is being subjected to a conventional physical test for static door-side intrusion. The vehicle 10 is a conventional four-door vehicle having a driver side front door 12, a driver side rear door 14, a passenger side front door 16, and a passenger side rear door 18. The doors 12, 14, 16, 18 of the vehicle 10 are all mounted with respect to a body 20 of the vehicle 10.

The static door side intrusion test is conducted using an intruder 22 that is brought into contact with a door of the vehicle 10, such as the driver side front door 12. The intruder 22 is typically in the form of a rigid semi-cylinder having a height less than that of the door itself. The intruder 22 is positioned so that the bottom of the intruder is higher than a door sill 24 that is defined by the vehicle body 20 of the vehicle 10.

The intruder 22 is supported such that it may be door 12 of the vehicle 10 under controlled condition, such as a predetermined speed and force. This may be accomplished, for example, by providing the intruder 22 in the form of a hydraulic ram that is moveable with respect to a fixed base 26. During the door-side intrusion test, the resistance strength provided by the door 12 is measured, along with the degree of intrusion of the door 12 into the interior of the vehicle 10. Due to the static nature of this test, the vehicle 10 is maintained in a substantially fixed position during the test.

Figure 2A:
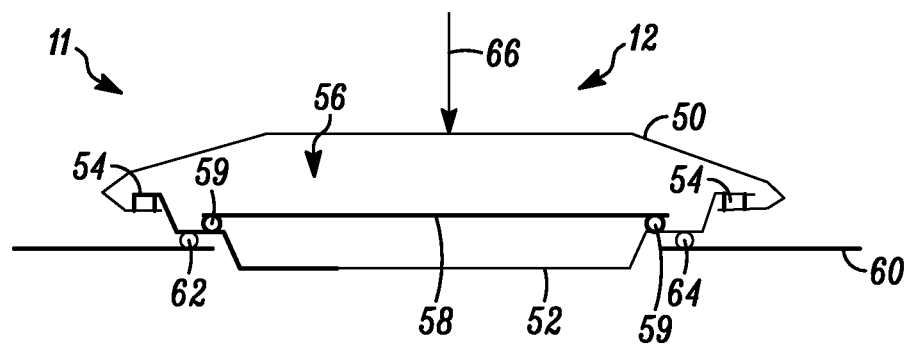
FIG. 2A is an illustration showing a body element including door a vehicle body portion surrounding the door prior to an impact event.
Figure 2B:
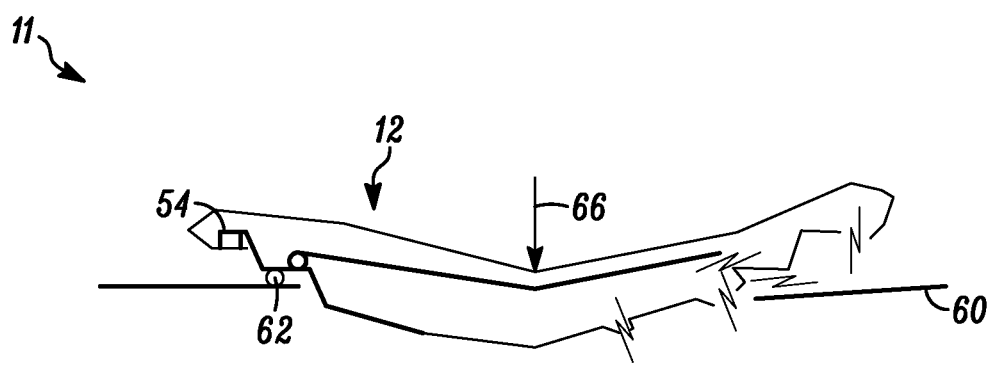
FIG. 2B is an illustration showing the body element of FIG. 2A subsequent to the impact event.

FIGS. 2A-2B show a body element 11 of the vehicle 10. The body element 11 is an area of the vehicle that is of interest during physical or simulated impact test. With reference to the door side intrusion testing described herein, the body element includes the driver side front door 12 and a body portion 60 surrounding the driver side front door 12. However, it should be understood that the body element 11 is described in this manner for convenience, and other portions of the vehicle 10 could be utilized as the body element 11.

The body element 11 includes one or more yieldable features. The yieldable features may include hem connections 54, spot weld connections 59, hinge connections 62, and latch connections 64.

For example, the driver side front door 12 includes an outer panel portion 50 and an inner panel portion 52 that are connected to one another by hem connections 54. The outer panel portion 50 and the inner panel portion 52 cooperate to define a hollow interior 56 for the door 12. One or more cross members 58 are situated within the hollow interior 56 and are connected to the inner panel portion 52 by spot weld connections 59. The driver side front door is secured to a body portion 60 of the vehicle 10 that surrounds the door by a hinge connection 62 and a latch connection 64, both of which are bolted to one or both of the door 12 and the body portion 60 surrounding the door 12. These features are yieldable in that they are considered to have some likelihood of failure during an impact event. In particular, when an impact load 66 is applied to the door 12, such as by the intruder 22, one or more of these features might fail. As a result, one or more ruptures 68 are expected to be present within the structure of the body element 11 subsequent to the impact event. The ruptures 68 represent features that are no longer capable of transmitting load or providing support within the structure of the body element 11.

Figure 3:
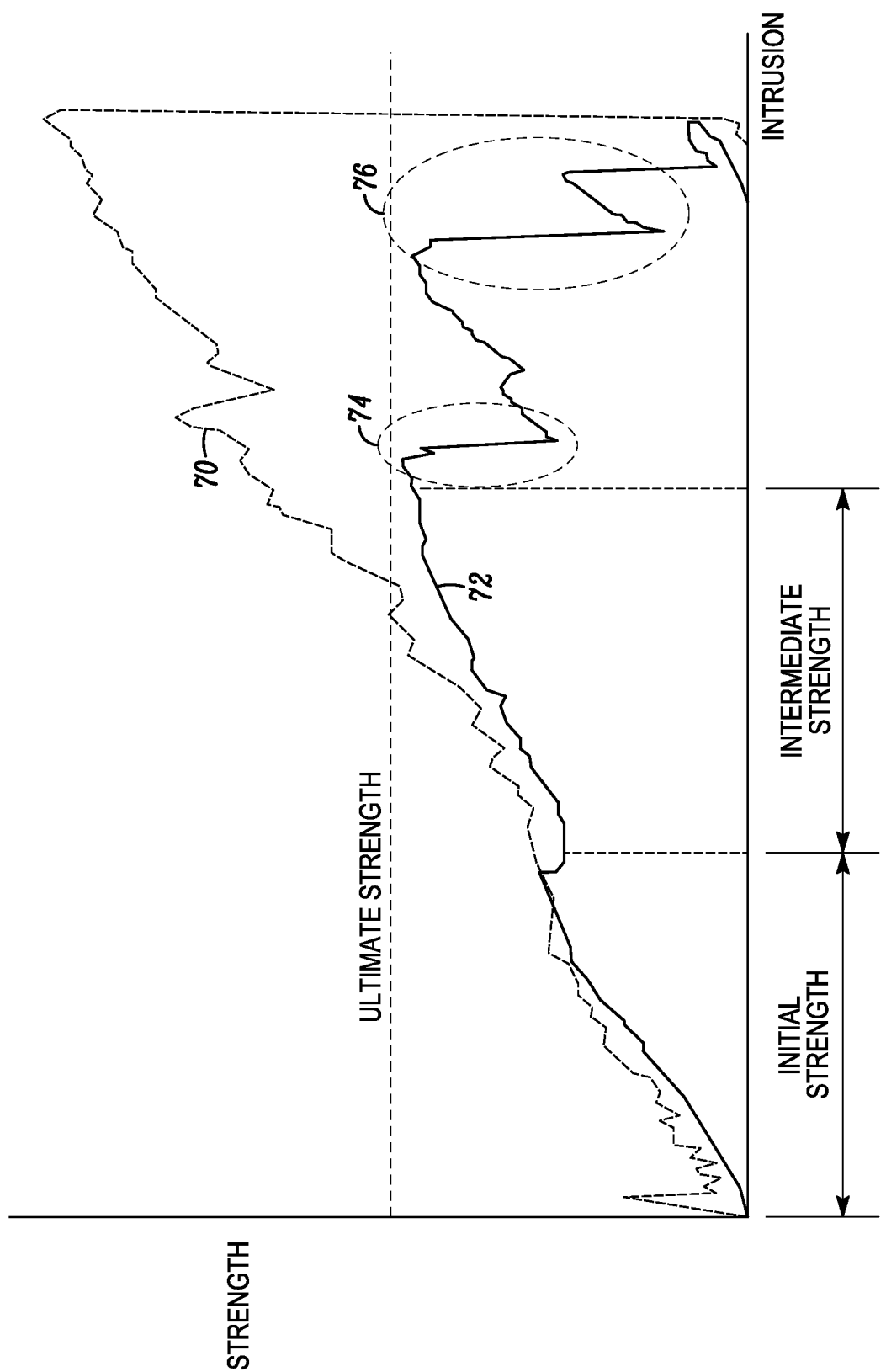
FIG. 3 is a graph comparing actual performance of the body element during the conventional physical test for side door intrusion to simulated performance of the body element during a conventional simulation.

FIG. 3 is a graph showing the strength of the body element 11 during an impact event as a function of the degree of intrusion of the door 12 into the interior of the vehicle 10. In this context, the strength of the body element 11 represents the degree to which the door resists further intrusion into the vehicle 10.

During an initial strength period, the results of a conventional simulation 70 correlates with the results of a physical test 72, such as the one described in connection with FIG. 1. In particular, both the conventional simulation 70 and the physical test 72 exhibit a substantially linear relationship between strength and degree of intrusion at a first slope in the initial strength period.

In an intermediate strength period, the physical test 72 continues to exhibit a linear relationship between strength and intrusion, but at a slightly reduced slope as compared to the initial strength period. During the intermediate strength period, however, the conventional simulation 70 diverges from the physical test 72 and continues to rise at a slope similar to that shown in the initial strength period, prior to a dramatic increase in slope, whereby the strength computed as a result of additional intrusion rises dramatically.

Subsequent to the intermediate strength period, the results of the physical test 72 evidence several severe, instantaneous drops in strength. The first such drop is a result of major ruptures 74, and subsequent drops are the result of door separation 76. Based on the highest strength exhibited prior to these drops, an ultimate strength for the body element 11 is determined. The conventional simulation, however, exhibits a continued rise in strength subsequent to the intermediate strength. This causes the conventional simulation to evidence a strength that is artificially much greater than the ultimate strength exhibited during the physical test 72.

Figure 4:
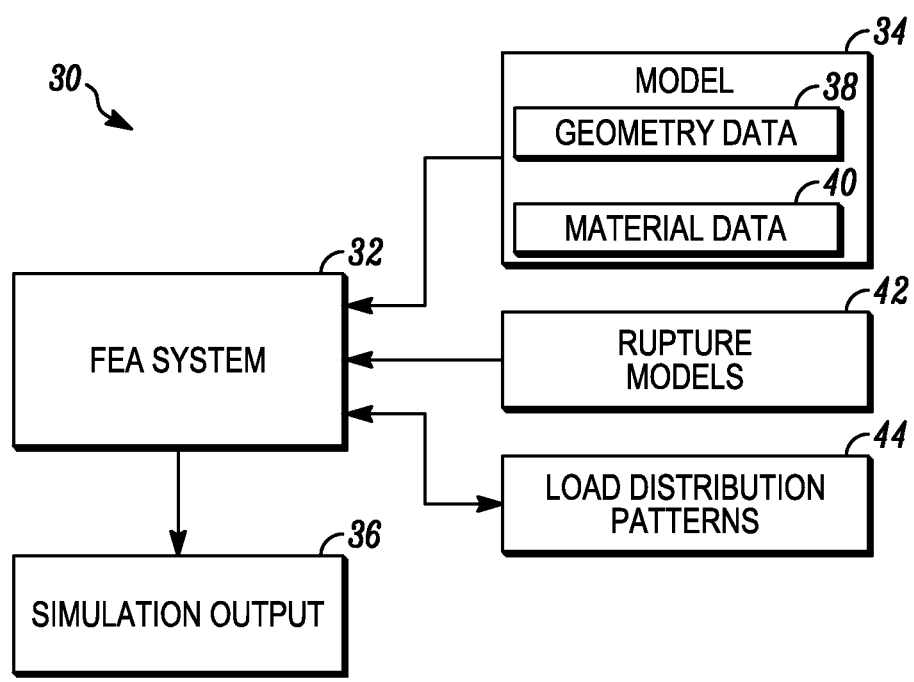
FIG. 4 is a block diagram showing an impact simulation system according to the invention.

The door side intrusion crash testing can be simulated using an impact simulation system 30 according to the invention, as shown in FIG. 4. The impact simulation system 30 is a computer implemented simulation that uses a finite element analysis system 32 that receives a model 34 as its input. As its output, the impact simulation system 30 produces a simulation output 36 representing the deformation of the body element 11 of the motor vehicle 10 during an impact event.

The finite element analysis system 32 may be a conventional programmable computer such as a personal computer or a network of computers that includes conventional finite element analysis software that is capable of interpreting the model 34, performing the simulation, and providing the simulation output 36. Thus, the finite element analysis system 32 may include such conventional features as a processor, random access memory, read-only memory, storage media, input devices, and output devices.

The model 34 contains the data upon which the simulation will be based. This data includes geometry data 38 and material property data 40. In addition to the model 34, rupture models 42 are also provided to the finite element analysis system 32. The simulation performed by the finite element analysis system is also based on load distribution patterns 44. As will be explained in detail herein an initial load distribution pattern 44 is calculated for an initial condition of the model 34 prior to the impact event, and updated load distribution patterns 44 are calculated during the simulation.

The geometry data 38 includes data representing the geometrical features of the vehicle 10, including the body element 11 that is the subject of the simulation. Essentially, the geometry data 38 is a three dimensional representation of the vehicle 10 or a portion thereof, which has been expressed in numerical terms, such as by defining any or all of points, lines, surfaces, or volumes that describe the geometrical configuration of the vehicle 10 or the portion thereof that is to be modeled during the simulation. The material property data 40 is associated with the geometry data 38 and describes the materials utilized for construction of the vehicle 10 in order to provide a more accurate simulation. The material property data 40 may include material types, densities, strengths, and other criteria utilized by the finite element analysis system 32, as is well-known in the art.

The rupture models 42 are utilized by the finite element analysis system 32 for determining whether specific portions of the model 34 are in a failure condition based on the simulation output 36 that is produced by the finite element analysis system 32. In particular, the rupture models 42 are sets of criteria or conditions that, when satisfied, indicate that a body element of the vehicle 10, as represented by the model 34, is in a failure condition. The rupture models 42 may be provided for any particular portions of the model 34, as represented by the geometry data 38, as is desired. Herein, specific rupture models 42 will be described in detail with reference to features of particular interest, such as the yieldable features of the body element 11, as previously described. However, it should be understood that the rupture models 42 could include rupture models for additional features as well.

The load distribution patterns 44 are utilized by the finite element analysis system 32 to distribute an impact loading that results from simulated impact of the intruder 22 with the body element 11 of the vehicle 10. As is typical in a finite element analysis, the load distribution patterns 44 are generated by the finite element analysis system 32 based upon the geometry data 38 and the material property data 40 of the model 34. In particular, the load distribution patterns 44 may represent a subdivision (meshing) of the model 34 into a series of sub-elements and boundary conditions that regulate how the impact load is distributed throughout the model 34.

The simulation output 36 includes data indicative of the deformation of the vehicle 10 or body elements thereof, such as the driver side front door 12, during an impact event. The simulation output 36 further includes data regarding the positions, velocities, and forces present within discrete portions of the model 34 as represented by the geometry data 38. These data values are recorded within the simulation output 36 on a time basis. For example, a complete set of data representing the state of the model 34 during the simulation may be recorded for each of a plurality of successive time intervals.

Figure 5:
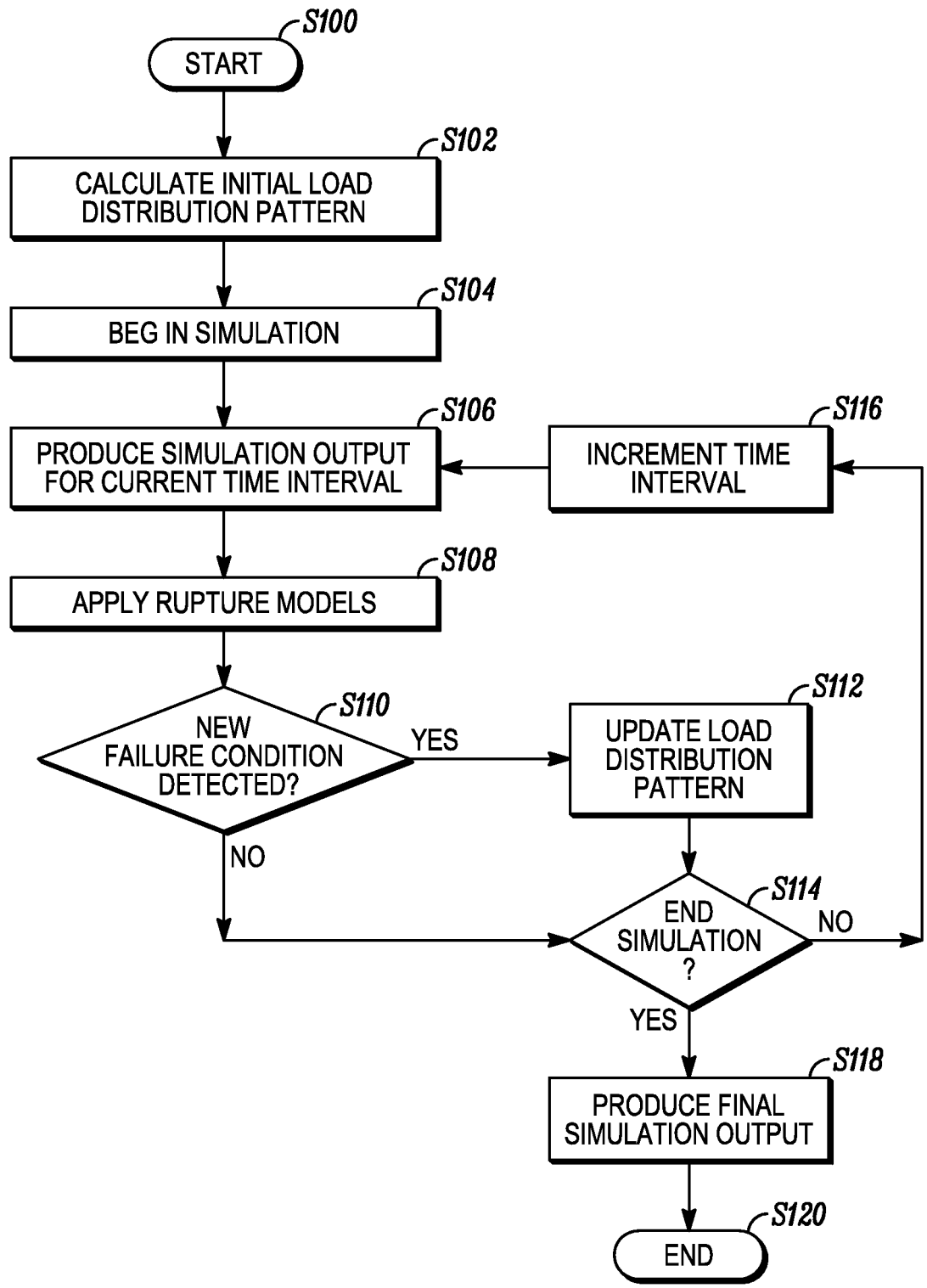
FIG. 5 is a flow chart showing operation of the impact simulation system according to the invention.

Operation of the impact simulation system 30 will now be explained with reference to FIG. 5. In Step S100, a simulation is started, at which time the model 34 is provided to the finite element analysis system 32. The process then proceeds to Step S102, where the finite element analysis system 32 calculates the load distribution pattern 44 for the initial condition of the model 34. The process then proceeds to Step S104.

In Step 104, the simulation is conducted by applying an impact load, which corresponds to an impact event to be simulated, to an area of the model 34 representing the body element 11. The process then proceeds to Step S106, wherein a portion of the simulation output 36 is produced for the current time interval.

The simulation output 36 computed in Step S106 for the current time interval is then processed in Step S108 by applying one or more rupture models 42 to identified features of the model 34. During application of the rupture models 42, the portion of the simulation output 36 that was produced in Step S106 is analyzed to determine whether any portion of the body element 12 is in a failure condition based on the simulation output 36 and the rupture model 42. The process then proceeds to Step S110.

Next, in Step S110, it is determined whether a new failure condition has been detected by application of the rupture models 42 in Step S108. If a new failure condition is detected, the process proceeds to Step S112. Otherwise, the process advances to Step S114.

In Step S112, the load distribution pattern 44 is updated to incorporate failure of the feature of the model 34 that was been determined to be in a failure condition in Steps S108 and S110. In particular, an updated load distribution pattern 44 will now account for the fact that the failed by preventing load from being distributed through that feature of the model 34. This changes the manner in which load is conducted through the remainder of the structure, given that the load that was previously accommodated by the now-failed feature must travel along a different path. After the load distribution pattern 44 has been updated in Step S112, the process advances to Step S114.

In Step S114, it is determined whether or not the simulation should end. This determination can be based on any number of criteria. For example, the simulation could be configured to run for predetermined length of time, or until a certain displacement, deformation, or degree of failure has occurred within the model 34.

If, in Step S114, it is determined that the simulation is not to end, the process advances to Step S116. In Step S116, the time interval is incremented, and the process is returned to Step S106 for further processing. On the other hand, if it is determined in Step S114 that the simulation should end, a final Simulation output 36 is produced. The final simulation output 36, as previously noted, can contain all of the data computed and recorded for each time period of the simulation, including positions, velocities, strengths, loadings, and failures of the various portions of the model 34. The process then ends in Step S120.

From the foregoing, it will be appreciated that the simulation is conducted using the load distribution pattern 44 corresponding to the initial condition of the model 34 during a first portion of the impact event, prior to the detection of any failure conditions. Thus, this simulation output 36 is generated for those time intervals prior to the detection of a failure condition using the load distribution pattern 44 corresponding to the usual condition of the model 34. Then, when it is determined that a portion of the body element 12 that is represented by the model 34 is in a failure condition based on the simulation output 36, the load distribution pattern for at least a portion of the body element 12 is updated in Step S112, and the simulation output 36 for subsequent time intervals is generated using the updated load distribution pattern 44.

From the foregoing, it will be appreciated that the rupture models 42 may be tailored specifically to respective yieldable features. By way of example, and not limitation, representative rupture models 42 corresponding to bolts, as in the hinge connection 62 and the latch connection 64, spot weld connections 59, panels, such as the inner panel portion 52 or the outer panel portion 50, or a hem, such as the hem connections 54.

As previously noted, the hinge connection 62 and the latch connection 64 typically include bolts, which are considered to be a yieldable feature of each of the hinge connection 62 and the latch connection 64. Thus, the rupture models 42 may include a rupture model for a bolt that indicates whether the force is developed within a predetermined area surrounding the bolt, as represented by the model 34, exceed an assumed rupture strength for the bolt. In this regard, it should be noted that the failure condition assessed in Step S110 will include failure of the bolt when the force is developed within the predetermined area surrounding the bolt, as represented by the model 34, exceed the assumed rupture strength for the bolt. When this occurs, the updated load distribution pattern computed in Step S112 will incorporate failure of the bolt.

A simple bolt separation criterion is adapted wherein-in the bolts are assumed to separate when the tensile and shear forces exceed the corresponding bolt strengths in an elliptic envelope, as represented by Equation 1.

$$(|F_n|/A_n)^j + (|F_s|/A_s)^k > 1 \qquad (1)$$

In Equation 1, $F_n$ and $F_s$ are the normal and shear forces experienced in the bolts and $A_n$ and $A_s$ are the corresponding bolt rupture strengths. Studying its simplest form, the tensile and shear strengths can be assumed to be equal ($A_s = A_n$) following the circular rule (j=k=2). A rupture criteria, such as an assumed strength or stress value of the above-noted rupture models can be adjusted based on the empirical coupon test results to conform the simulation output 36 to the empirical test results.

As with the bolt, a rupture model for the spot weld connections 59 indicates whether the force is developed within a predetermined area surrounding the spot weld connections 59, as represented by the model 34, exceed an assumed rupture strength for the spot weld connections 59. In this case, the failure condition assessed in Step S110 will include failure of the spot weld connection 59 when the force is developed within the predetermined area surrounding the spot weld connection 59, as represented by the model 34, exceed the assumed rupture strength for the spot weld connection 59. When this occurs, the updated load distribution pattern 42 that is computed in Step S112 will incorporate failure of the spot weld connection 59.

A rupture envelope for each of the spot weld connections 59 is defined as an elliptic bound for shear and normal strengths, as in Equation 2.

$$(F_n/A_n)^2 + (F_s/A_s)^2 > a \qquad (2)$$

In Equation 2, $F_n$ and $F_s$ are the normal and shear forces experienced in the spot weld connections 59 are $A_n$ and $A_s$ are the corresponding spot weld rupture strengths empirically determined with series of specimen tests as functions of the gages and strengths of the connected parts. A rupture criteria, such as an assumed strength or stress value of the above-noted rupture models can be adjusted based on the empirical coupon test results to conform the simulation output 36 to the empirical test results.

As previously noted, the rupture models 42 may also include a rupture model for a panel, such as the inner panel portion 52 or the outer panel portion 50 of the door 12. The rupture model for the panel indicates whether the strain induced within at least a portion of the panel exceeds an assumed rupture strain for the panel. Thus, the failure condition assessed at Step S110 will determine that the panel has failed when the rupture model 42 indicates that the strain induced within at least a portion of the panel, such as the inner panel portion 52 or the outer panel portion 50, exceeds an assumed rupture strain for the panel. In this case, the updated load distribution pattern 42 that is calculated in Step S112 will incorporate failure of the panel.

An anisotropic elasto-plastic material including a damage model is utilized as a rupture model for the panel. Plastic hardening and strain rate behavior are maintained as in the base material model. The damage model is based on a forming limit diagram (FLD) wherein the damage (D) is defined as the difference between FLD strain value ($\epsilon_{FLD}$) at the minimum principal strain value ($\epsilon_{P2}$) and the maximum principal strain value ($\epsilon_{P1}$), as in Equation 3.

$$D = \epsilon_{P1} - \epsilon_{FLD}(\epsilon_{P2}) \quad (3)$$

In Equation 3, if the damage is positive (D>0) for a shell element, the element is assumed to be damaged/ruptured and is removed for further analysis. As an example, the baseline value for the anisotropic plastic strain value is considered as 0.25 based on typical automobile doors such as the door 12. A rupture criteria, such as an assumed strength or stress value of the above-noted rupture models, can be adjusted based on the empirical coupon test results to conform the simulation output 36 to the empirical test results.

As also previously noted, the yieldable features includes the hem connections 54 which may be defined by a contact point between two portions such as the outer panel portion 50 and the inner panel portion 52, as explained with reference to FIG. 2. The rupture model for the hem connections 54 indicates whether the force is developed at the contact point exceed an assumed rupture strength for the hem. Alternatively, the rupture model for the hem may indicate whether the stress developed at the contact point exceeds an assumed rupture stress value for the hem connection 54. Thus, the failure condition assessed in Step S110 will indicate that the hem connection 54 has failed when the forces developed at the contact point exceed the assumed rupture strength for the hem connection 54 or when the stress developed at the contact point exceeds the assumed rupture stress value for the hem connection 54. Then, the updated load distribution pattern will be computed in Step S112 to indicate failure of the hem connection 54.

The hem connection 54 is modeled as tied contacts with the standard force based rupture model based on the forces experienced in the contact, as represented by Equation 4.

$$(F_n/A_n)^2 + (F_s/A_s)^2 > 1 \quad (4)$$

In Equation 4, $F_s$ and $F_n$ are the shear and normal forces transacted through the tie connection between two nodes; and $A_s$ and $A_n$ are the corresponding rupture forces at which the tie connection is removed between the two nodes as per the relation given above. The force based criteria is normally based on an assumption of uniform mesh size and the nodal force limits are computed accordingly for each tie connection. However, the mesh size can potentially vary along the hem and hence a stress-based rupture model can be utilized to avoid the influence of mesh variation on the rupture model, as in Equation 5.

$$(\sigma_n/\psi_n)^2 + (\sigma_s/\psi_s)^2 > 1 \quad (5)$$

In Equation 5, $\sigma_s$ and $\sigma_n$ are the shear and normal stresses experienced in the tie connection between two nodes; and $\psi_s$ and $\psi_n$ are the corresponding rupture stresses. The rupture force (stress) values are borrowed from the prior knowledge of the door designs under consideration.

The basic rupture models 42 noted above may be calibrated to improve the results of the simulation conducted using the impact simulation system 30. In particular, calibration allows baseline assumed rupture values, which are based on material properties under static conditions, to be adjusted to reflect the dynamic conditions experienced during an impact event. Thus, the assumed rupture values may be adjusted to a percentage of the baseline values as a result of calibration.

In particular, the rupture models 42 for the yieldable features may be calibrated using empirical test results to correlate the first simulation output 36 to the empirical test results. This may be done by comparing the results of a physical test with the simulation output 36 and then adjusting the rupture models 42 in order to cause the simulation output 36 to more closely approximate the results obtained with the physical test. A rupture criteria, such as an assumed strength or stress value of the above-noted rupture models can be adjusted based on the empirical coupon test results to conform the simulation output 36 to the empirical test results.

Furthermore, both during the physical test and the simulation, the yieldable features will tend to rupture in a certain pattern. Thus, the rupture models 42 may be calibrated using the empirical test results to correlate the simulation output 36 to the empirical test results such that the rupture sequence obtained by the simulation output 36 matches an empirically-observed rupture sequence.

Figure 6:
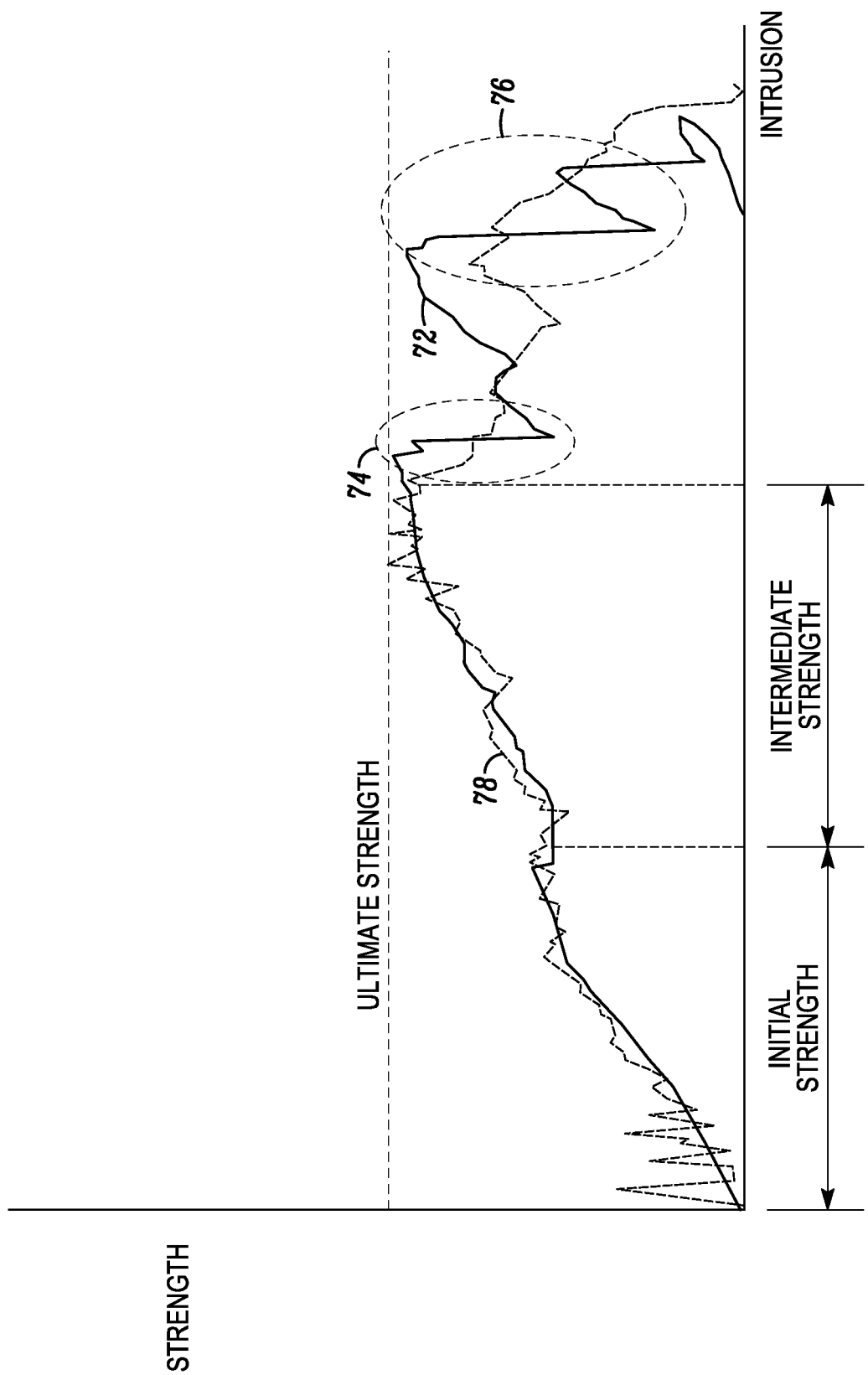
FIG. 6 is a graph comparing actual performance of the body element during the conventional physical test for side door intrusion to simulated performance of the body element during a correlated simulation according to the invention.

FIG. 6 is a graph showing the strength of the body element 11 during an impact event, where the results of the physical test 72 are compared to the results of a correlated simulation 78 performed using the impact simulation system 30 according to the invention, with rupture criteria calibrated as taught herein. The results of the correlated simulation 78 exhibit a high degree of correlation with the physical test 72 in terms of initial, intermediate and ultimate strengths, major structural failures and separations and the strength and intrusion at which they occur, and the deformation modes of the door 12 of the body element 11.

While the invention has been described with reference to the door 12 as the body element 11 under consideration, it should be understood that the impact simulation system 30 and associated methods could be applied in other contexts, and to other portions of the vehicle 10. Furthermore, the specific yieldable features described herein are illustrative, and do necessarily limit the invention, as other yieldable features could be considered. Likewise, the rupture models 42 and the rupture criteria discussed herein are illustrative, and additional rupture models 42 and rupture criteria could be utilized in the manner taught and described herein, within the scope of the invention.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A computer implemented method for simulating the deformation of a body element of a motor vehicle that occurs during an impact event, comprising:

providing a finite element model of the body element that includes a initial load distribution pattern;

generating a first simulation output including data indicative of the deformation of the body element during a first portion of the impact event, wherein the first simulation output is generated using the initial load distribution pattern by a finite element analysis system executing on a computer;

determining whether a portion of the body element is in a failure condition based on the first simulation output;

if a failure condition is determined, updating, using the computer, the load distribution pattern of at least a portion of the body element; and generating a second simulation output including data indicative of the deformation of the body element during a second portion of the impact event, wherein the second simulation output is generated using the updated load distribution pattern by said finite element analysis system.

2. The method of claim 1, wherein the model of the body element includes one or more yieldable features.

3. The method of claim 2, wherein the model of the body element includes a rupture model for the one or more yieldable features.

4. The method of claim 3, wherein the failure condition is determined if one or more of the yieldable features has failed using the rupture model.

5. The method of claim 3, further comprising:
calibrating the rupture model for the one or more yieldable features using empirical test results to correlate the first simulation output to the empirical test results.

6. The method of claim 5, further comprising:
calibrating the rupture model for the one or more yieldable features using empirical test results to correlate the first simulation output to the empirical test results by adjusting at least one rupture criteria of the rupture model of the one or more yieldable features based on the empirical test results to conform the first simulation output to the empirical test results.

7. The method of claim 3, further comprising:
calibrating the rupture model for the one or more yieldable features using empirical test results to correlate the first simulation output to the empirical test results such that a simulated rupture sequence matches an empirically observed rupture sequence.

8. The method of claim 3, wherein the one or more yieldable features including at least one of a bolt, a spot weld, a panel or a hem.

9. The method of claim 3, wherein the one or more yieldable features includes a bolt, and the rupture model for the bolt indicates whether forces and/or stresses developed within a predetermined area surrounding the bolt as represented by the model exceed an assumed rupture strength for the bolt.

10. The method of claim 9, wherein the failure condition includes failure of the bolt when the forces and/or stresses developed within the predetermined area surrounding the bolt as represented by the model exceed the assumed rupture strength for the bolt, and the updated load distribution pattern incorporates failure of the bolt.

11. The method of claim 3, wherein the one or more yieldable features includes a spot weld, and the rupture model for the spot weld indicates whether the forces and/or stresses developed within a predetermined area surrounding the spot weld as represented by the model exceed an assumed rupture strength for the spot weld.

12. The method of claim 11, wherein the failure condition includes failure of the spot weld when the forces and/or stresses developed within the predetermined area surrounding the spot weld as represented by the model exceed the assumed rupture strength for the spot weld, and the updated load distribution pattern incorporates failure of the spot weld.

13. The method of claim 3, wherein the one or more yieldable features includes a panel, and the rupture model indicates whether the strain induced within at least a portion of the panel exceeds an assumed rupture strain and/or stress for the panel.

14. The method of claim 13, wherein the failure condition includes failure of the panel when the rupture model indicates that the strain and/or stress induced within at least a portion of the panel exceed an assumed rupture strain and/or stress for the panel, and the updated load distribution pattern incorporates failure of the panel.

15. The method of claim 3, wherein the one or more yieldable features include a hem having at least two portions having a tied contact point, and the rupture model for the hem indicates whether the force and/or stress developed at the contact point exceeds an assumed rupture stress value for the hem.

16. The method of claim 15, wherein the failure condition includes failure of the hem when the rupture model for the hem indicates that the stress developed at the contact point exceeds the assumed rupture stress value for the hem, and the updated load distribution pattern includes failure of the hem.

17. The method of claim 3, wherein the body element of the motor vehicle is a door structure including a door and a body portion surrounding the door.

18. The method of claim 17, wherein the one or more yieldable features include a mounting structure that connects the door to the body portion surrounding the door.

19. A computer implemented method for simulating the deformation of a body element of a motor vehicle that occurs during an impact event, comprising:
providing a finite element model of the body element that includes a initial load distribution pattern, the model of the body element including one or more yieldable features;
providing a rupture model for at least one of the one or more yieldable features;
calibrating the rupture model for the at least one yieldable feature using an empirical test result to correlate the first simulation output to the empirical test result;
generating a first simulation output including deformation of the body element during a first portion of the impact event wherein the first simulation output is generated using the initial load distribution pattern by a finite element analysis system executing on a computer;
determining whether a portion of the body element is in a failure condition by using the rupture models for the one or more yieldable features;
if a failure condition is determined, updating, using the computer, the load distribution pattern of at least a portion of the body element; and
generating a second simulation output including deformation of the body element during a second portion of the impact event, wherein the second simulation output is generated using the updated load distribution patter pattern by said finite element analysis system.

* * * * *